United States Patent [19]

Maehashi

[11] 4,181,861

[45] Jan. 1, 1980

[54] NOISE-INHIBITING CIRCUIT RESPONSIVE TO A SIGNAL SUPPLIED ONLY TO THE FIRST STAGE OF THE CIRCUIT

[75] Inventor: Yukio Maehashi, Tokyo, Japan

[73] Assignee: Nippon Electric Co., Ltd., Tokyo, Japan

[21] Appl. No.: 884,398

[22] Filed: Mar. 8, 1978

[30] Foreign Application Priority Data

Mar. 9, 1977 [JP] Japan ................................. 52/26208

[51] Int. Cl.² .............................................. H03K 1/10
[52] U.S. Cl. ............................ 307/221 C; 307/247 A
[58] Field of Search ............ 307/247 A, 221 C, 221 R; 328/165

[56] References Cited

U.S. PATENT DOCUMENTS

| | | | |
|---|---|---|---|
| 3,725,680 | 4/1973 | Silva | 307/247 A |
| 3,745,371 | 7/1973 | Suzuki | 307/221 C |
| 3,824,583 | 7/1974 | Turtle | 307/247 A |
| 3,988,597 | 10/1976 | Yamaguchi | 307/247 A |
| 3,989,960 | 11/1976 | Kodama | 307/247 A |
| 3,993,916 | 11/1976 | Copeland et al. | 307/221 C |

FOREIGN PATENT DOCUMENTS

1188647 3/1965 Fed. Rep. of Germany ...... 307/247 A

Primary Examiner—John S. Heyman
Attorney, Agent, or Firm—Hopgood, Calimafde, Kalil, Blaustein & Lieberman

[57] ABSTRACT

A circuit for removing noise from an incoming input signal and for producing a noise free output signal in synchronism with a predetermined synchronization scheme. The memory signal is shifted through a plurality of series connected memory stages in sequence with first and second clock pulse sequences. The output signals of predetermined memory stages are compared and a noise free output signal is produced in response to stage output signals being simultaneously present at the output terminal of predetermined memory stages. The circuit does not utilize capacitors and resistors and is suitable for fabrication as an integrated circuit.

18 Claims, 10 Drawing Figures

NOISE-INHIBITING CIRCUIT RESPONSIVE TO A SIGNAL SUPPLIED ONLY TO THE FIRST STAGE OF THE CIRCUIT

FIELD OF THE INVENTION

This invention relates to a noise-inhibiting circuit for preventing noise from appearing in the output signal of the circuit and more particularly to a shaping circuit for producing a shaped output signal with noise removed therefrom.

BACKGROUND OF THE INVENTION

Recent information processing systems, such as electronic computers, utilize large-scale integrated circuits (LSI) that serve as wired logic or logic circuits. Wired logic in an information processing system are designed to operate in synchronism with clock pulse sequences in a predetermined scheme of synchronization. Data signals supplied to the system through input devices are generally asynchronous signals that are not necessarily synchronized with the predetermined synchronization scheme. The data signals are often supplied from other information processing systems utilizing different synchronization schemes. Therefore an output signal synchronizing circuit is in information processing systems indispensable.

Along with the incoming asynchronous signals, noise is inevitably supplied to the information processing system. It is therefore necessary that the output signal synchronizing circuit be capable of suppressing or inhibiting the input noise in order to produce noise-free synchronized output signals. It is to be noted that noise suppression in such circuit is difficult due to the fact that input noise has a shorter duration than the asynchronous signals.

In U.S. Pat. No. 3,753,135 granted to Gerhard Kastner et al, a circuit of the type specified is disclosed which includes a counter, a two-input AND gate for delivering a clock pulse sequence to the counter during the presence of an input signal, and an inverter for supplying an inverted input signal to the counter as a reset signal. The counter is reset in the absence of the input signal, which may be an incoming asynchronous signal or a noise input. When the input signal is an incoming asynchronous signal, the counter counts the clock pulses to at least a preset count to produce an output signal synchronized with the clock pulse sequence. When the input signal is a noise input, the count never reaches the preset count and therefore no output signal is produced in response to the input noise.

In the circuit taught by Kastner et al, the input signal is used both in enabling the AND in gate and resetting the counter. In other words, a single signal is used to control a plurality of elementary circuits and these elementary circuits do not necessarily respond to signals of a common threshold level. Control of the elementary circuits is therefore subject to failure when the level of the input signal fluctuates due to noise or for other reasons. For example, an input signal might cause the AND gate to supply clock pulses to the counter while keeping the counter in the reset state or input noise superimposed on a proper input asynchronous signal might repeatedly reset the counter thereby causing a circuit malfunction. In addition reset signal should be given priority as compared with the clock pulses delivered to the counter through the AND gate. Due to the circuitry required to establish priority, the circuit according to Kastner et al is inevitably complicated in structure.

A chattering prevention circuit or a bounce noise prevention circuit is operable as a shaping circuit of the type mentioned at the outset of the instant specification. Various chattering prevention circuits are known in the art, such as those disclosed in U.S. Pat. No. 3,725,680 issued to John R. Silva, U.S. Pat. No. 3,824,583 issued to Quentin C. Turtle U.S. Pat. No. 3,989,960 issued to Yukuo Kodama, an assignor to the present assignee, and German "Auslegeschrift" No. 1,188,647 for a bounce impulse suppression circuit invented by Hans Gerhard Gatermann et al.

According to Silva or Turtle, a chattering prevention circuit comprises in principle, a first differentiator for producing a first differentiated signal in response to an input signal that may be accompanied by chattering, a first one-shot or monostable multivibrator responsive to the differentiated signal for producing a first signal of a longer duration than the chattering, a second differentiator responsive to the first signal for producing a second differentiated signal, a second monostable multivibrator responsive to the second differentiated signal for producing a second signal of a predetermined duration, a sensor responsive to the input signal for producing a sensor signal after termination of the chattering, and means responsive to the sensor signal for deriving the second signal from the second monostable multivibrator. The differentiators utilized in Silva or Turtle use capacitors and resistors and therefore it is clear that the circuits according to Silva or Turtle are undesirable in that these are difficulties in manufacturing the capacitors and the resistors with uniform characteristics to insure accurate operation, and in fabricating the circuit into an integrated circuit.

According to Kodama, a chattering prevention circuit comprises a series connection of T flip-flops, responsive to an input signal liable to be accompanied by chattering, for counting clock pulses of a clock pulse sequence to produce a counter signal a predetermined period after the start of the input signal, an RS flip-flop set by the counter signal to produce a gate signal, and an AND gate enabled by the gate signal for allowing the input signal to pass therethrough as an output signal whereby the chattering included in the predetermined period is removed from the output signal. Although no capacitors are used, the input signal is supplied to reset terminals of the T flip-flops and also supplies to the AND gate. The chattering prevention circuit is therefore still undesirable in that a single signal is used to control a plurality of elementary circuits and undesirable because noise inputs are superimposed on the input signal, the T flip-flops may be erroneously repeatedly reset. When this occurs output signal is thereby produced either after an objectionable delay or piecemeal as a plurality of output signal portions, or the output signal may not be produced at all. The T flip-flops then have to be reset with a priority signal which complicates the circuitry.

According to Gatermann et al, a chattering prevention circuit comprises a first and a second flip-flop, each having a set and a reset terminal, with the flip-flops being driven by a three-phase clock pulse sequence. During the presence of an input signal, that may be accompanied by chattering, the first flip-flop is set by a clock pulse of a first phase to produce a set output. When both the input signal and the set output are present, the second flip-flop is set by a clock pulse of a second phase to produce an output signal exempted from the chattering that may be included in the interval between the pulses of the first and the second phases. The first flip-flop is reset by a clock pulse of a third phase. The circuit comprises a plurality of AND gates for the input signal, the set output, and the clock pulses. The input signal is supplied to at least two of the AND gates for the respective flip-flops and the circuit therefore has the defects inherent when a single signal controls a plurality of elementary circuits. Moreover, production of a clock pulse sequence of three phases requires complicated circuitry and the necessity of resetting the first flip-flop by the pulse of the third phase reduces the speed of operation.

It is therefore an object of the present invention to provide a noise-inhibiting circuit that is simple in structure and yet operable to produce an output signal in response to each proper input signal without responding to noise inputs.

It is another object of this invention to provide a noise-inhibiting circuit of the type described, which operates correctly even when noise is superimposed on the input signal.

It is still another object of this invention to provide a noise-inhibiting circuit of the type described, which is suited for fabrication as an integrated circuit.

It is yet another object of this invention to provide a noise-inhibiting circuit of the type described, which is capable of producing an output signal in synchronism with a predetermined synchronization scheme.

SUMMARY OF THE INVENTION

In accordance with a first aspect and feature of this invention, there is provided a circuit comprising an input terminal for a circuit input signal, an output terminal for a circuit output signal, and first and second clock input terminals for a first and a second clock pulse sequence, respectively. The first and the second clock pulse sequences are synchronized with each other. The circuit further comprises a plurality of memory stages of a first type, each having a stage input terminal and a stage output terminal and also comprising a transfer gate connected to the stage input terminal which is rendered conductive in response to pulses of the first clock pulse sequence. Also included is a temporary memory between the transfer gate and the stage output terminal, a plurality of memory stages of a second type, each having a stage input terminal and a stage output terminal. The memory stages comprise a transfer gate connected to the stage input terminal of the second-type memory stage which is rendered conductive in response to pulses of the second clock pulse sequence. A temporary memory is included between the transfer gate and the stage output terminal of the second-type memory stage, and connection means connecting the first-type and the second-type memory stages in series allow the circuit input signal to be shifted through the series connected memory stages in synchronism with the pulses of the first and the second clock pulse sequences. Comparing means are also included which are connected to the stage output terminals of predetermined ones of the memory stages of prescribed ones of the first and second types of memory stages. The comparing means compare the stage output signals appearing at the stage output terminals of the predetermined memory stages with one another to produce a result signal when the stage output signals are simultaneously present at the stage output terminals of the predetermined memory stages. Finally output means are included which are responsive to the result signal for supplying the circuit output signal to the circuit output terminal.

Preferably at least one particular memory stage is interposed between the circuit input terminal and the predetermined memory stages. In this instance the circuit further comprises a holding circuit for carrying out positive feedback of the stage output signal appearing at the stage output terminal of the particular memory stage back to the temporary memory of the particular memory stage during the absence of the clock. In response thereto the transfer gate of the particular memory stage is rendered conductive.

According to another aspect and feature of this invention, the output means of the circuit (defined above) generally comprise shift register means for allowing the result signal to be stepwise shifted therethrough in synchronism with the pulses of the first and the second clock pulse sequences to produce a shift register signal, and a comparator device for comparing the result and the shift register signals with each other to supply the circuit output signal to the circuit output terminal when successive changes occur in the result and the shift register signals, respectively.

According to still another aspect and feature of this invention, there is provided a circuit comprising means for memorizing an input signal for a first period, means for shaping the memorized signal, means for synchronizing the shaped signal with a predetermined synchronization scheme, means for giving the synchronized signal a delay for a second period longer than said first period, means for comparing the synchronized signal with the delayed signal to produce a comparison result signal when both the result and the delayed signals are simultaneously present, and output means responsive to the result signal for producing a circuit output signal.

With any one of the circuits according to the above-described aspects and features of this invention, a circuit input signal that disappears while being shifted through the predetermined memory stages is determined to be a noise input and no circuit output signal is thereby produced. It is thus possible to inhibit or suppress input noise with the instant invention. With an incoming asynchronous circuit input signal, a circuit output signal is produced in synchronism with a synchronization scheme specified by the first and the second clock pulse sequences. When use is made of the shift register means and of the clock pulse sequences of a common clock period defining a one bit interval, a circuit according to the second-mentioned aspect of this invention produces, in response to a circuit input signal, a circuit output signal of a duration or pulse width having a certain number of bit intervals. The number of bit intervals are prescribed by the number of memory stages of the shift register means. As will later be detailed the holding circuit of the instant invention reduces the adverse effects which otherwise would result from noise.

The circuits according to this invention need not utilize capacitors and resistors. The circuit input signal is supplied to the transfer gate of the particular or first memory stage only during intervals in which the transfer gate is rendered conductive. It is therefore possible to achieve correct, stable, and reliable operation without the use of capacitors and resistors. Inasmuch as the memory stages are of the same structure, except for the control by only two clock pulse sequences, the circuit according to this invention is quite simple in structure.

For the circuit according to this invention, it is readily possible to provide each transfer gate by an insulated-gate field effect transistor (IGFET), each temporary memory by a few IGFET's, and each of the comparison means, such as a NAND gate, and the shift register means again by IGFET's. It is therefore possible to manufacture the whole circuit as an integrated circuit with no additional external circuit elements. The circuits according to this invention are readily adapted to various input noise durations by choosing the number of the predetermined and the interposed memory stages and the desired output pulse width can be varied by selection of the number of the memory stages of the shift register means. The foregoing and other objects and features of this invention will be more fully understood from the following description of an illustrative embodiment thereof taken in conjunction with the accompanying drawings.

DESCRIPTION OF THE PREFERRED EMBODIMENTS

Figure 1:
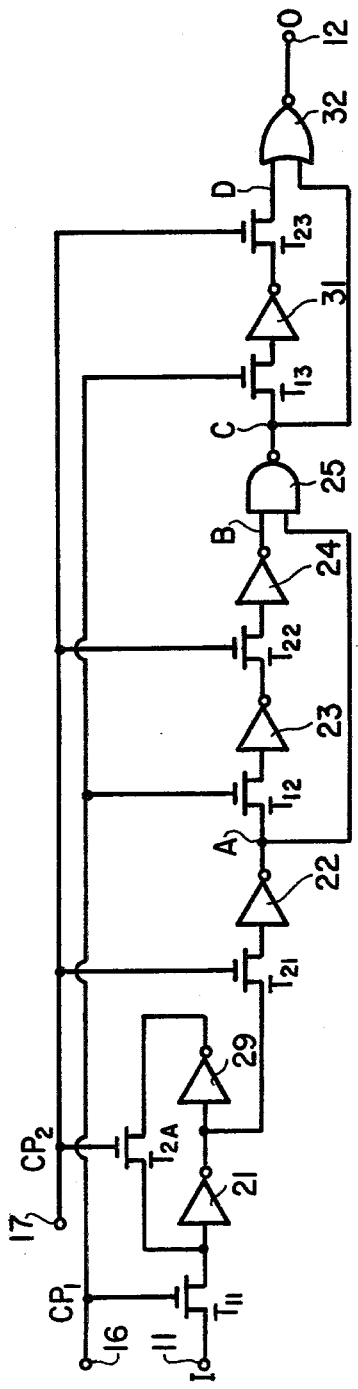
FIG. 1 illustrates a circuit according to a first embodiment of the present invention.

Referring to FIG. 1, a circuit according to a first embodiment of the present invention has a circuit input terminal 11 for a circuit input signal I, a circuit output terminal 12 for a circuit output signal O, and first and second clock input terminals 16 and 17 for first and second clock pulse sequences $CP_1$ and $CP_2$ that have a common clock period defining one bit interval of the circuit. The circuit comprises a plurality of memory stages of a first type, such as a first and a second first-type memory stage, each having a stage input terminal with each memory stage being a stage output terminal and controlled by the first clock pulse sequence $CP_1$. Each of a plurality of memory stages of a second type, such as first and second second-type memory stages, have stage input and output terminals and are controlled by the second clock pulse sequence $CP_2$. The first memory stage of the first type comprises a first-type transfer gate connected to the stage input terminal of that memory stage the transfer gate is rendered conductive in response to pulses of the first clock pulse sequence $CP_1$. Also included is a temporary memory between the transfer gate and the stage output terminal of that memory stage. In the illustrated noise-inhibiting circuit, the first memory stage of the first type comprises a first insulated-gate field effect transistor (IGFET) $T_{11}$ as the transfer gate and a first inverter 21 as the temporary memory. The IGFET $T_{11}$ has a source electrode connected to the stage input terminal, a gate electrode connected to the first clock input terminal 16, and a drain electrode. The inverter 21 has an input connected to the drain electrode and an output connected to the stage output terminal. Similarly, the first memory stage of the second type comprises a second IGFET or transfer gate $T_{21}$ and a second inverter or temporary memory 22. The second memory stage of the first type comprises a third IGFET $T_{12}$ and a third inverter 23. The second memory stage of the second type comprises a fourth IGFET $T_{22}$ and a fourth inverter 24. The first-type and the second-type memory stages are allernatingly connected in series. The stage input terminal of one of the alternate connected first-type and second-type memory stages is connected to the stage output terminal of another one of the memory stages. The stage input terminal of a particular one of the memory stages, such as the first memory stage of the first type, is connected to the circuit input terminal 11. The memory stages thus form a first one-bit shift register through which the circuit input signal I is shifted in synchronism with the pulses of the first and the second clock pulse sequences $CP_1$ and $CP_2$ to appear as stage output signals at the respective stage output terminals. The stage output terminals of predetermined ones of the memory stages, of prescribed ones of the first and second types, such as the stage output terminals indicated by points A and B, are connected to inputs of a NAND gate 25 having an output connected to a third point C. Point C is connected to the circuit output terminal 12 through a second one-bit shift register described hereinafter. In the illustrated example, the predetermined memory stages are successive memory stages of the prescribed type.

In connection with the circuit illustrated in FIG. 1, it is to be understood that the particular memory stage, namely, the first memory stage of the first type, is interposed between the circuit input terminal 11 and the predetermined memory stages, namely, the first and the second memory stages of the second type and the second memory stage of the first type. At least a portion of each pulse of one of the first and the second clock pulse sequences intervenes with the pulses of the other of the clock pulse sequences. The first memory stage of the first type is accompanied by a holding circuit for carrying out positive feedback of the stage output signal, appearing at the stage, output terminal of that memory stage back to the temporary memory 21 of that memory stage during the absence of the clock pulses. In response thereto the transfer gate $T_{12}$ of that memory stage is rendered conductive. The holding circuit may comprise an additional inverter 29, having an input connected to the stage output terminal, and an output and an additional IGFET $T_{24}$ between the additional inverter output and the input of the first inverter 21. The additional IGFET $T_{24}$ has a gate electrode connected to the second clock input terminal 17. The circuit depicted in FIG. 1 further comprises a circuit for defining a pulse width of the circuit output signal, which is connected to the noise-inhibiting circuit at the third point C. The pulse width defining circuit comprises the second shift register similar in structure to the first shift regester. In the illustrated example, the second shift register comprises two memory stages which are provided by third memory stages, respectively, of the first and the second types, in the noise-inhibiting and output signal synchronizing circuit. The third memory stage of the first type comprises a fifth IGFET or transfer gate $T_{13}$ and a fifth inverter or temporary memory 31. The third memory stage of the second type comprises a sixth IGFET $T_{23}$ and a NOR gate 32 that has two inputs and which an output and serves as a temporary memory. One of inputs of the NOR gate 32 is connected to the output of NAND gate 25 at the third point C and the other input is connected, to the sixth IGFET $T_{23}$ at a fourth point D. The output of the NOR gate 32 is connected to the circuit output terminal 12.

Figure 2:
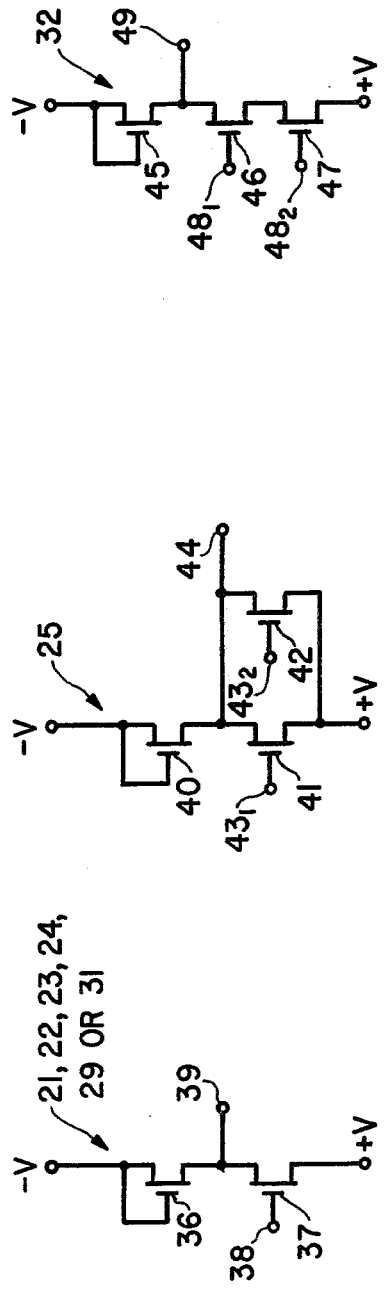
FIG. 2 shows an inverter preferably used in a circuit according to this invention.

Turning to FIG. 2, an example of the inverters 21 through 24 and 31 comprise a load IGFET 36 having a gate electrode, a source electrode connected to the gate electrode (supplied with a negative voltage $-V$) and a drain electrode. A memory IGFET 37 has a gate electrode connected to the transfer gate of that memory stage at a point 38, a source electrode, (supplied with a positive voltage $+V$), and a drain electrode connected to the load IGFET drain electrode and to the stage output terminal at a point 39. The gate capacity of the memory IGFET 37 serves as a memory element. The positive and the negative voltages $+V$ and $-V$ may be supplied either from a single power source or from two separate power sources. Alternatively, one of the positive and the negative voltages $+V$ and $-V$ may be ground potential.

Figure 3:
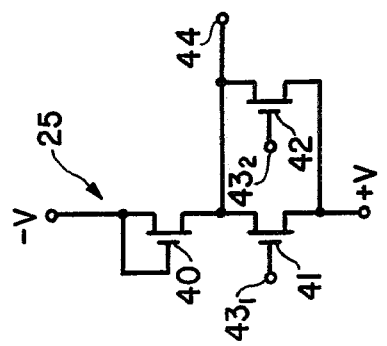
FIG. 3 shows a NAND gate preferably used in a circuit according to this invention.

Referring to FIG. 3, the NAND gate 25 may comprise a load IGFET 40 and a first NAND IGFET 41 similar to the load and the memory IGFET's 36 and 37 of the inverter exemplified in FIG. 2. The NAND gate 25 further comprises a second NAND IGFET 42 shunting the first NAND IGFET 41. Gate electrodes of NAND IGFET's 41 and 42 are connected to the inputs of NAND gate 25 at points $43_1$ and $43_2$. Drain electrodes are connected in common to output of the NAND gate 25 at a point 44. The NAND gate 25 may further comprise NAND IGFET or IGFET's (not shown) for other NAND input or inputs.

Figure 4:
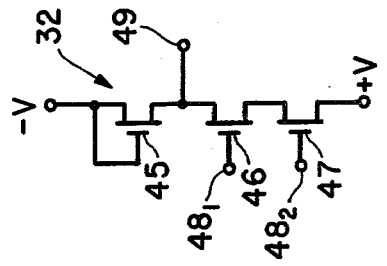
FIG. 4 shows a NOR gate preferably used in a circuit according to this invention.

Referring to FIG. 4, the NOR gate 32 may comprise a load IGFET 45, a first NOR IGFET 46, and a second NOR IGFET 47 as in the NAND gate 25 exemplified in FIG. 3. The NOR IGFET's 46 and 47, having gate electrodes connected to the inputs of the NOR gate 32 at points $48_1$ and $48_2$, are connected in series rather than in parallel. The output of the NOR gate 32, shown at 49, is connected to a point of connection between the load IGFET 45 and the series connection of the NOR IGFET's 46 and 47. The gate capacities, particularly the gate capacitance of the NOR IGFET 47, remote from the NOR output, serve as memory elements.

In operation, it is assumed for simplicity of description that the IGFET's, used in the circuit illustrated with reference to FIG. 1 and exemplified in FIGS. 2 through 4, are p-channel IGFET's that are rendered conductive and nonconductive when signals supplied to the gate electrodes are of low and high levels, respectively. The low and high levels correspond to logic "0" and "1" levels, respectively, and pulses of the first and the second clock pulse sequences $CP_1$ and $CP_2$ are used as write-in and read-out pulses, respectively. The first-type transfer gates $T_{11}$, $T_{12}$, and $T_{13}$ are therefore put in the conductive and the nonconductive states when the write-in pulses $CP_1$ take low or logic "0" and high or logic "1" levels, respectively. The second-type transfer gates $T_{21}$, $T_{22}$, and $T_{23}$ are rendered conductive and non-conductive when the read-out pulses $CP_2$ take low or logic "0" and high or logic "1" levels, respectively. The additional IGFET $T_{24}$ is conductive during at least portions of those intervals at which the write-in pulses $CP_1$ are high. The clock period should naturally be shorter than a period during which information is memorized in the inverters 21 through 24, 29 and 31 and in the NOR gate 32.

Figure 5:
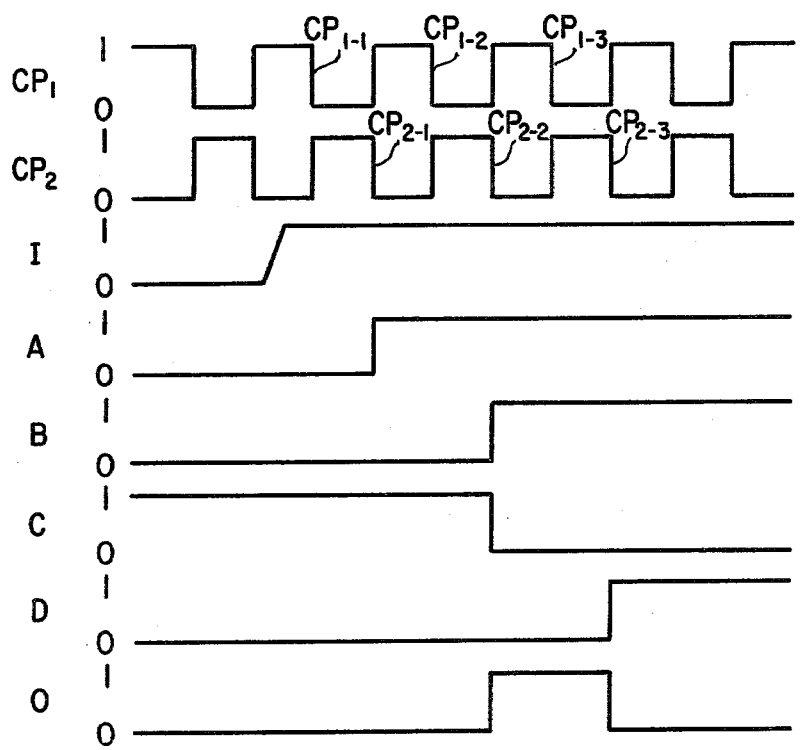
FIG. 5 is a timing diagram of a first set of two clock pulses sequences used in a circuit according to this invention and several signals that appear at various points in the circuit depicted in FIG. 1 in response to an input signal.

Referring to FIG. 5, a first set of examples of the write-in and the read-out clock pulse sequences $CP_1$ and $CP_2$ have a common duty cycle of 50%. As shown along two top rows labelled $CP_1$ and $CP_2$, the write-in pulses $CP_1$ have leading and trailing edges substantially coincident with the trailing and leading edges, respectively, of the read-out pulses $CP_2$. The clock pulse sequences $CP_1$ and $CP_2$ thus serve as a two-phase clock pulse sequence. If the circuit input signal I has a duration of a plurality of bit intervals as exemplified by row I, and thus is an incoming information signal, the circuit input signal I is written in the first inverter 21 through the first transfer gate $T_{11}$ as soon as the trailing edge of a write-in pulse $CP_{1-1}$ appears for the first time after build up of the input signal I. The written-in information is shifted to the first point A, through the second transfer gate $T_{21}$, and the second inverter 22, as depicted by row A, as soon as the trailing edge of a read-out pulse $CP_{2-1}$ appears for the first time after appearance subsequent to the trailing edge of the first write-in pulse $CP_{1-1}$. The information shifted to point A is further shifted to the third inverter 23 and through the third transfer gate $T_{12}$ by the trailing edge of a second write-in pulse $CP_{1-2}$. This occurs immediately following the first write-in pulse $CP_{1-1}$ and the information is delivered to the second point B, as illustrated by row B, as soon as a second read-out pulse $CP_{2-2}$, next following the first read-out pulse $CP_{2-1}$, goes low. As shown, the signal at the first point A goes from the low logic "0" level to the high logic "1" level at the trailing edge of the first read-out pulse $CP_{2-1}$. This process is repeated with the signal at the second point B, at the trailing edge of the second read-out pulse $CP_{2-2}$. Therefore signal delivered by the NAND gate 25, to the third point C goes from the high logic "1" level to the low logic "0" level as depicted by row C at that trailing edge of the second read-out pulse $CP_{2-2}$. This pulse is coincident with the leading edge of a third write-in pulse $CP_{1-3}$ next subsequent to the second write-in pulse $CP_{1-2}$.

Further referring to FIG. 5, the noise-inhibiting circuit output signal, shown by C, is shifted to the fifth inverter 31 through the fifth transfer gate $T_{13}$ at the trailing edge of the third write-in pulse $CP_{1-3}$. This signal is then delivered to point D through the sixth transfer gate $T_{23}$, as depicted by row D, at the trailing edge of a third read-out signal $CP_{2-3}$, next following the second read-out pulse $CP_{2-2}$. Inasmuch as the signals at the third and the fourth points C and D are of the low logic "0" level, only between the trailing edges of the second and the third read-out pulses $CP_{2-2}$ and $CP_{2-3}$, the NOR gate 32 gives a low logic "0" level circuit output signal, illustrated by bottom row O and a high logic "1" level for one bit interval in synchronism with the read-out clock pulse sequence $CP_2$.

Figure 6:
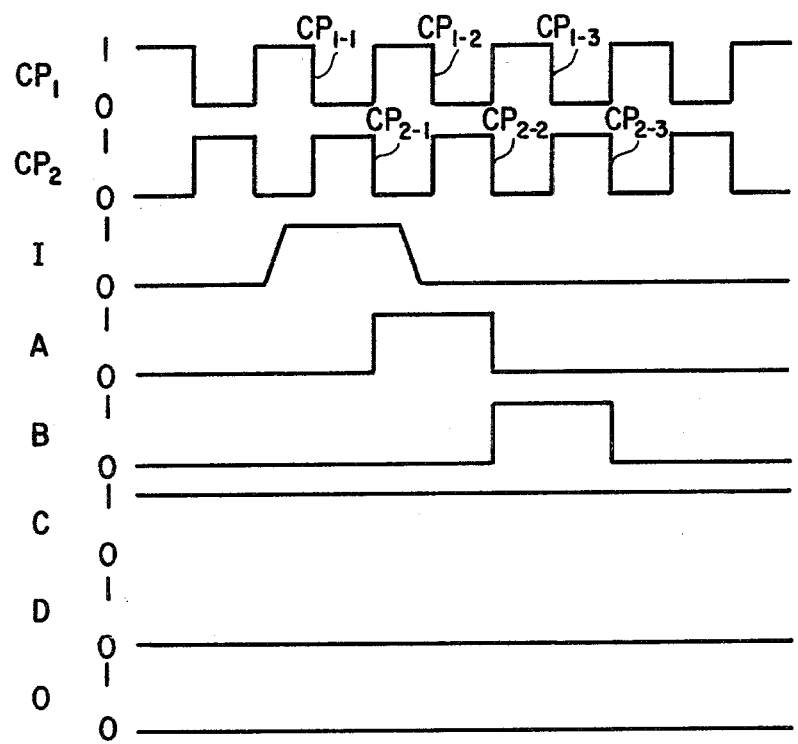
FIG. 6 is a timing diagram corresponding to FIG. 5 with an input noise supplied to the circuit shown in FIG. 1 rather than an input signal.

Turning to FIG. 6, the top through the bottom rows, labelled $CP_1$, $CP_2$, I, A, B, C, D, and O, correspond to the similarly labelled rows in FIG. 5. The write-in and the read-out clock pulse sequences $CP_1$ and $CP_2$ are similar to those depicted in FIG. 5. The circuit input signal I, however, lasts less than one bit interval and is a noise input. The write-in and the read-out pulses $CP_1$ and $CP_2$ are numbered as in FIG. 5 in connection with an instant of the build up of noise input I. As described, the signal at the first point A, is rendered high, or logic "1" at, the trailing edge of the first read-out pulse $CP_{2\text{-}1}$. This signal, however, returns to the low logic "0" level when the trailing edge of the second read-out pulse $CP_{2\text{-}2}$ appears to raise the signal at the second point B to the high logic "1" level. It is to be noted that signals supplied to NAND gate 25 are never applied simultaneously with the high logic "1" level. The signal at the third point C is thus kept at the high logic "1" level. As a further consequence, the circuit output signal O is kept at the low logic "0" level. It is therefore possible to prevent the noise input I from appearing both in the noise-inhibiting circuit output signal, at the third point C, and in the circuit output signal O.

In connection with the above-described operation, it may be mentioned here that a signal is incapable of being memorized in the first inverter 21, of the type illustrated in FIG. 2 unless the signal has a sufficient duration or pulse width at the trailing edge of the write-in pulse $CP_1$ to charge the gate capacity of the memory IGFET 37. The situation is also similar for a first temporary memory of a different structure. It follows therefore that a circuit according to this invention neglects those noise inputs which appear during intervals other than the trailing edge intervals of the write-in pulses $CP_1$ or that appear at these trailing edges with an insufficient pulse width. It should be also noted that holding circuit maintains the circuit input signal I for the first inverter 21 even when the write-in pulses are of the high level. Furthermore, the holding circuit insures application of correct logic "0" and "1" signals from the first inverter 21 to the next following memory stage even when the logic level of the signal supplied to the first inverter 21 is unstable due to, for example, fluctuations of the power supply voltages.

Figure 7:
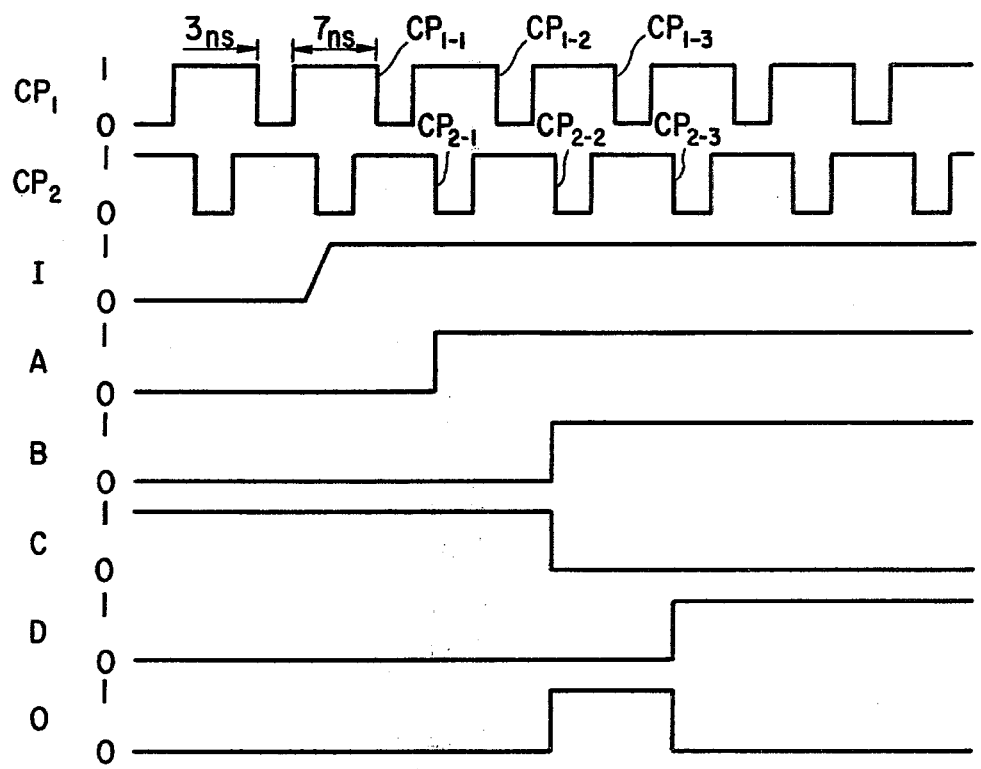
FIG. 7 is a timing diagram of a second set of two clock pulse sequences and several signals that appear at various points of the circuit illustrated in FIG. 1 in response to the illustrated clock pulse sequences and to an input signal.
Figure 8:
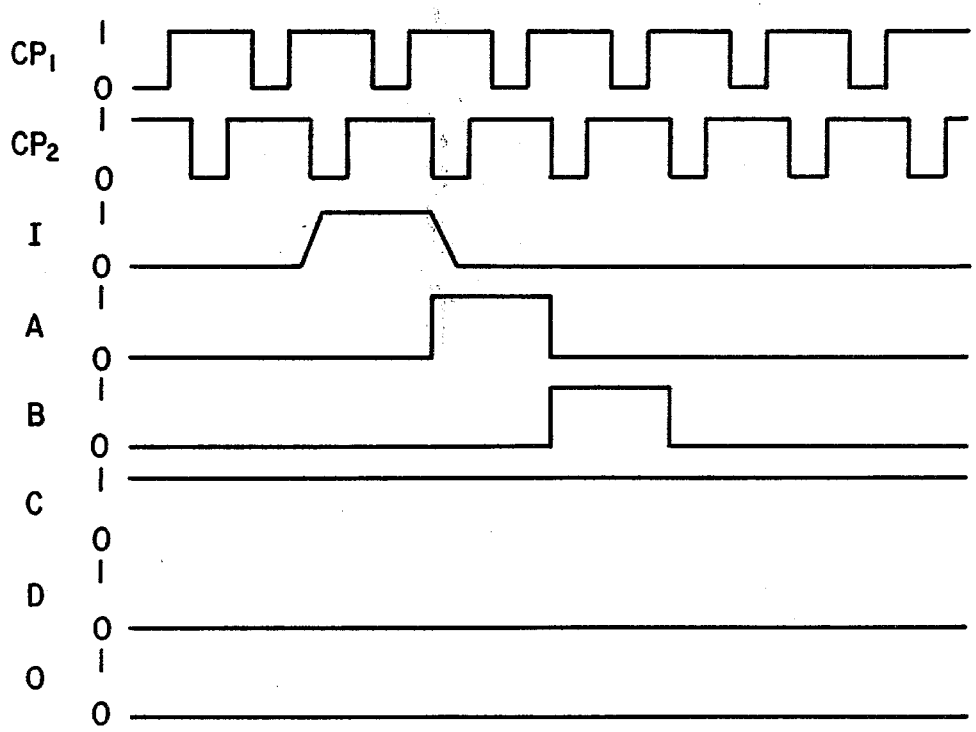
FIG. 8 is a timing diagram corresponding to FIG. 7 with input noise supplied to the circuit depicted in FIG. 1 instead of an input signal.

Turning to FIGS. 7 and 8, the top through the bottom rows labelled $CP_1$, $CP_2$, I, A, B, C, D and O correspond to the similarly labelled rows in FIGS. 5 and 6. The clock pulse sequences $CP_1$ and $CP_2$ have a clock period of 10 ns and alternatingly appearing low or logic "0" levels of only 3 ns. The clock pulse sequences $CP_1$ and $CP_2$ therefore simultaneously take the high or logic "1" level for 7 ns. The circuit illustrated in FIG. 1 comprises the circuit elements described in conjunction with FIGS. 2 through 4 and this circuit is powered by the positive and the negative voltages $+V$ and $-V$ given by ground and a voltage between $-10$ and $-12$ volts. Accordingly, the logic "1" and "0" levels of the signals used or dealt with are the ground level and a level between $-10$ and $-12$ volts, respectively. It will readily be understood that the circuit produces, and does not produce, a circuit output signal when a circuit input signal has a duration longer and shorter, respectively, than about 10 ns. Use of the clock pulse sequences illustrated in FIG. 7 is preferred because the isolated low level periods prevent misoperation of the shift registers. In addition, the longer ground potential periods of the clock pulse sequences $CP_1$ and $CP_2$ reduce the electric power required by a clock generator (not shown).

Figure 9:
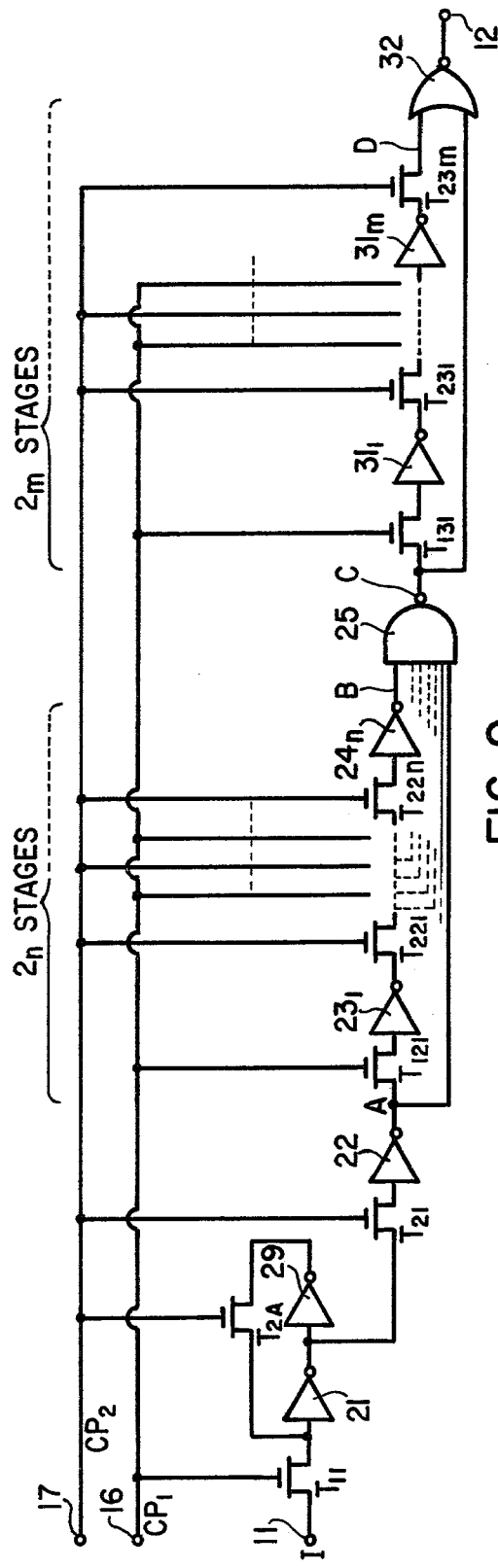
FIG. 9 illustrates a circuit according to a second embodiment of this invention.

Referring now to FIG. 9, a circuit according to a second embodiment of this invention comprises similar parts designated by like reference numerals and alphabets as in FIG. 1. The circuit is for producing, and not producing, a circuit output signal in response to an incoming circuit input signal lasting longer than n bit intervals and to a noise input signal shorter than n bit intervals, respectively. By the accompanying pulse width defining circuit, a circuit output signal of a duration or pulse width equal to m bit intervals is produced only in response to an incoming circuit input signal. It will readily be understood that both n and m represent integers that may or may not be equal to each other. Between the first and the second points A and B, the circuit comprises 2n first-type and second-type memory stages connected alternatingly in series. More particularly, the second memory stage of the first type, depicted in FIG. 1 and consisting of the third IGFET $T_{12}$ and the third inverter 23 is replaced by n memory stages of the first type consisting of IGFET's or transfer gates $T_{121}$, ..., and $T_{12n}$ (not shown) and inverters or temporary memories $23_1$, ..., and $23_n$ (not shown). These elements are interposed between the first point A and n memory stages of the second type comprising IGFET's or transfer gates $T_{221}$, ..., and $T_{22n}$ and inverters or temporary memories $24_1$ (not shown), ..., and $24_n$. The NAND gate 25 has (n+1) inputs connected to the first point A and to the respective stage output terminals of the n second-type memory stages, namely, to the outputs of the inverters 22 and $24_1$ through $24_n$. Instead of the third first-type and second-type memory stages. Consisting of IGFET's $T_{13}$ and $T_{23}$, the inverter 31, and the NOR gate 32, as depicted in FIG. 1, the second shift register of the illustrated circuit consists of m first-type IGFET's or transfer gates $T_{131}$, ..., and $T_{13m}$ (not shown), m second-type IGFET's or transfer gates $T_{231}$, ..., and $T_{23m}$, m and inverters or temporary memories $31_1$, ..., and $31_m$ (not shown) for the first-type transfer gates $T_{131}$ through $T_{13m}$. In addition (m-1) inverters or temporary memories (not shown) are utilized for the second-type transfer gates $T_{231}$ through $T_{23(m-1)}$ (not shown), and for two-input NOR gate 32 having its inputs connected to the third and the fourth points C and D.

Figure 10:
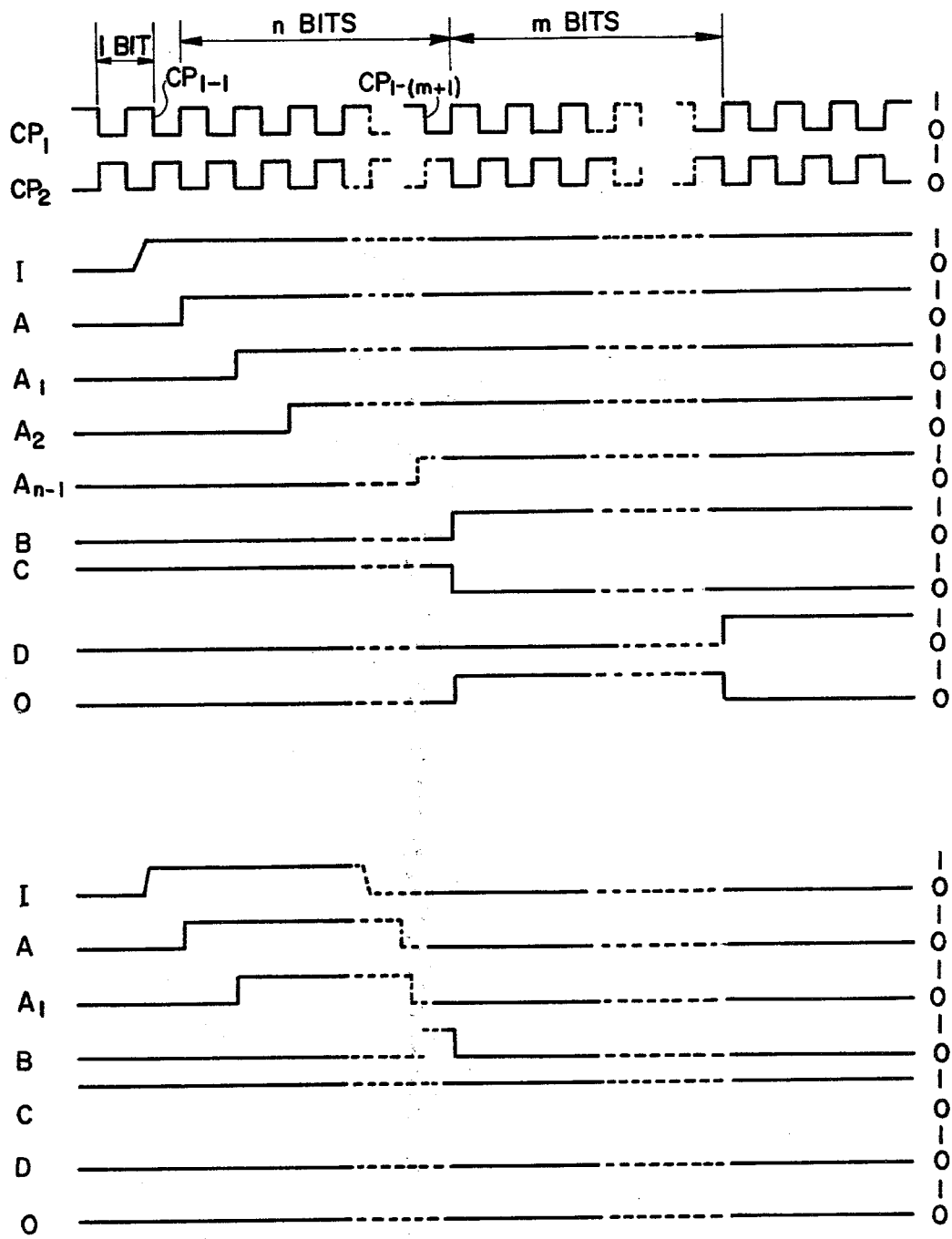
FIG. 10 is a timing diagram of signals that appear at several points of the circuit illustrated in FIG. 9 in response to the clock pulse sequences according to the first set of examples and to an input signal and input noise.

Finally referring to FIG. 10, the top through the fourth rows and four bottom rows labelled $CP_1$, $CP_2$, I, A, B, C, D and O in an upper half and similar rows labelled I, A, B, C, D, and O in a lower half correspond to likewise labelled rows in FIGS. 5 and 6. Rows labelled $A_1$, $A_2$, and $A_{n-1}$ show stage output signals at points $A_1$, $A_2$, and $A_{n-1}$ (not shown) between the inverter $24_1$ and the IGFET $T_{221}$ and the like wherein, the second point B corresponds to a point $A_n$. It will readily be understood that the circuit input signal I is shifted to the second point B with a delay equal to n bit intervals from the instant at which the signal I is shifted to the first point A. When the circuit input signal I is an incoming input signal and not noise, a high or logic "1" stage output signal appears at the second point B as depicted along the row B in the upper half. The NAND gate 25 supplies the third point C with a low logic "0" output signal as shown along the upper C row. The low output signal is shifted through the second shift register to reach the fourth point D, with a delay of m bit intervals, as a high logic "1" shift register signal illustrated along the upper D row. The NOR gate 32 produces a high logic "1" circuit output signal O that lasts m bit intervals as shown along the upper O row. It is possible to utilize a NAND gate (not shown) having n inputs or less connected to the inverters of predetermined ones of the memory stages of the second type. A NAND gate having, for example, only two inputs connected to the points A and B, however, will erroneously produce a circuit output signal of the type depicted along the upper C or D row when at least two isolated noise inputs happen to occur, with sufficient pulse widths, at the trailing edges of the first and the n-th write-in pulses $CP_{1-1}$ and $CP_{1-n}$ (instead of the n-th write-in pulse $CP_{1-n}$ an (n+1)-th write-in pulse $CP_{1-(n+1)}$ being illustrated), respectively.

From the circuits according to the above-described embodiments, it is now understood that the first temporary memory 21 serves in the circuit, along with a holding circuit, as means for memorizing an input signal for a first period. The holding circuit is used as means for shaping the memorized signal. The second transfer gate $T_{21}$ serves as means for synchronizing the shaped signal with a predetermined synchronization scheme. The memory stages interposed between the first and the second points A and B serve as means for giving the synchronized signal a delay of a second period longer than the first period. The NAND gate 25 is used as means for comparing the synchronized signal with the delayed signal to produce a comparison result signal when both the result and the delayed signals are simultaneously present. Either a mere connection or a combination of the second shift register and the NOR gate 32 serves as output means responsive to the result signal for producing a circuit output signal.

While this invention has thus far been described mainly in conjunction with two preferred embodiments of the invention and several modifications thereof, it is to be understood that other embodiments and modifications are possible within the spirit of this invention. For example, it is possible to use the transfer gates and the temporary memories of structures other than those illustrated with reference to FIGS. 2 through 4. The NAND gate 25 is used as a circuit element that changes the state of its output signal on detecting the fact that the same state is present at the output stages of the predetermined memory stages. It is therefore possible to substitute an AND gate for the NAND gate 25. Alternatively, a NOR gate may be substituted for the NAND gate 25 with inputs thereof supplied from the stage output terminals of the first-type memory stages rather than from those of the second-type ones. The NOR gate 32 described hereinabove has memory capability merely for the convenience of counting the number of stages of the second shift register. It is obvious that the NOR gate 32 is used as a comparator device for comparing the signals supplied from the third and the fourth points C and D, with each other, and NOR gate 32 will twice change the state of its output signal when changes successively occur in the states of the respective signals being compared. It is therefore possible to substitute a NAND or an AND gate for the NOR gate 32. The first and the second clock pulse sequences $CP_1$ and $CP_2$ must be synchronized with each other. A memory stage of the second type may be directly connected to the circuit input terminal 11 instead of one of the first type. It is also unnecessary that the first-type and the second-type memory stages be connected alternatingly in the series connection.

What is claimed is:

1. A circuit comprising: a circuit input terminal for a circuit input signal; a circuit output terminal for a circuit output signal; a first and a second clock input terminal for a first and a second clock pulse sequence, respectively, said first and said second clock pulse sequences being synchronized with each other; a plurality of memory stages of a first type, each having a stage input terminal and a stage output terminal and comprising a transfer gate connected to said stage input terminal, said transfer gate being rendered conductive in response to pulses of said first clock pulse sequence, and a temporary memory connected between said transfer gate and said stage output terminal;

a plurality of memory stages of a second type, each having a stage input terminal and a stage output terminal and comprising a transfer gate connected to said second-type memory stage input terminals, said transfer gate being rendered conductive in response to pulses of said second clock pulse sequence, and a temporary memory connected between said transfer gate and said second-type memory stage output terminals;

coupling means for coupling said first-type and said second-type memory stages in series so that said circuit input signal may be shifted through said series connected first and second type memory stages in synchronism with the pulses of said first and said second clock pulse sequences; comparison means, coupled to predetermined ones of the memory stages of a prescribed one of said first and said second type, for comparing the stage output signals of said predetermined memory stages with one another and for producing a result signal at the time the stage output signals are simultaneously present at the stage output terminals of said predetermined memory stages; and output means responsive to said result signal for supplying said circuit output signal to said circuit output terminal.

2. A circuit as claimed in claim 1, wherein a particular memory stage, positioned prior to said predetermined memory stages, comprises a holding circuit for carrying the output signal appearing at the stage output terminal of said particular memory stage back to the input of the temporary memory of said particular memory stage in the absence of the clock pulses in response to which the transfer gate of said particular memory stage is rendered conductive.

3. A circuit as claimed in claim 2, wherein said predetermined memory stages comprise the memory stages of said prescribed type which are successively connected, by said connection means, with pertinent ones of the memory stages of the other of said first and said second types interposed between said predetermined memory stages, whereby said result signal is produced when said circuit input signal lasts at least during the interval while it is being shifted through said predetermined memory stages.

4. A circuit as claimed in claim 3, wherein said particular memory stage is of said first type and, said predetermined memory stages are of said second type.

5. A circuit as claimed in claim 4, wherein said comparison means comprises an AND gate, having inputs connected to respective stage output terminals of said predetermined memory stages, and an output connected to said output means.

6. A circuit as claimed in claim 4, wherein said comparison means comprises a NAND gate having inputs connected to the respective stage output terminals of said predetermined memory stages and an output connected to said output means.

7. A circuit as claimed in claim 3, wherein said particular memory stage and said predetermined memory stage are of said first type.

8. A circuit as claimed in claim 7, wherein said comparison means comprise a NOR gate, having inputs connected to respective stage output terminals of said predetermined memory stages, and an output connected to said output means.

9. A circuit as claimed in claim 1, wherein said output means comprise means for supplying said result signal to said circuit output terminal as said circuit output signal.

10. A circuit as claimed in claim 9, wherein the temporary memory of each of the memory stages of said first and said second types comprises a load and a first insulated-gate field effect transistor having a gate electrode, a source electrode, and a drain electrode, and the transfer gate of said memory stages comprises a second insulated-gate field effect transistor having a gate electrode connected to a pertinent one of said first and said second clock input terminals, a source electrode connected to the stage input terminal of said memory stages, and a drain electrode connected to the gate electrode of said first insulated-gate field effect transistor.

11. A circuit comprising: a circuit input terminal for a circuit input signal; a circuit output terminal for a circuit output signal; a first and a second clock input terminal for a first and a second clock pulse sequence, respectively, said first and said second clock pulse sequences being synchronized with each other; a plurality of memory stages of a first type, each having a stage input terminal and a stage output terminal, and comprising, a transfer gate connected to said stage input terminal, said transfer gate being rendered conductive in response to pulses of said first clock pulse sequence, and a temporary memory between said transfer gate and said stage output terminal; a plurality of memory stages of a second type, each having a stage input terminal and a stage output terminal, and comprising, a transfer gate connected to said second-type memory stage input terminals, said transfer gate being rendered conductive in response to pulses of said second clock pulse sequence, and a temporary memory between said transfer gate and said second-type memory stage output terminals; coupling means for coupling said first-type and said second-type memory stages in series so that said circuit input signal may be shifted through said series connected memory stages of said first and second types in synchronism with the pulses of said first and said second clock pulse sequence; comparison means, coupled to predetermined ones of the memory stages of a prescribed one of said first and said second types, for comparing the stage output signals of said predetermined memory stages with one another and for producing a result signal when the stage output signals are simultaneously present at the stage output terminals of said prdetermined memory stages; a shift register shifting said result signal therethrough in synchronism with the pulses of said first and second clock pulse sequence; and pulse width determining means for receiving said result signal and a shifted signal through said shift register and for generating an output signal having a pulse width determined by said result signal and said shifted signal.

12. A circuit as claimed in claim 11, wherein a particular memory stage, positioned prior to said predetermined memory stages, comprises a holding circuit for carrying the stage output signal appearing at the stage output terminal of said particular memory stage back to the input of the temporary memory of said particular memory stage in the absence of the clock pulse in response to which the transfer gate of said particular memory stage is rendered conductive.

13. A circuit as claimed in claim 12, wherein said predetermined memory stages comprise the memory stages of said prescribed type which are successively connected, by said connection means, with pertinent ones of the memory stages of the other of said first and said second types interposed between said predetermined memory stages, whereby said result signal is produced when said circuit input signal lasts at least during the interval while it is being shifted through said predetermined memory stages.

14. A circuit as claimed in claim 13, wherein said particular memory stage is of said first type and said predetermined memory stages are of said second type.

15. A circuit as claimed in claim 14, wherein said comparison means comprises a NAND gate, having inputs connected to respective stage output terminals of said predetermined memory stages, and an output connected to the input of said shift register.

16. A circuit comprising means for memorizing an input signal for a first period, means for shaping the memorized signal, means for synchronizing the shaped signal with a predetermined synchronization scheme, means for delaying the synchronized signal for a second period, longer than said first period, means for comparing said synchronized signal with the delayed signal to produce a comparison result signal when both said synchronized and said delayed signals are simultaneously present, and output means responsive to said result signal for producing a circuit output signal.

17. A circuit as claimed in claim 16, wherein said output means comprises means for producing said result signal as said circuit output signal.

18. A circuit as claimed in claim 16, wherein said output means comprises means for further delaying said result signal a third period, longer than said first period, and means for comparing said result signal with the further delayed signal to produce said circuit output signal when said result and said further delayed signals are successively subjected to changes.

* * * * *